United States Patent [19]

Steckl et al.

[11] Patent Number: 5,759,908

[45] Date of Patent: Jun. 2, 1998

[54] METHOD FOR FORMING SIC-SOI STRUCTURES

[75] Inventors: Andrew J. Steckl, Cincinnati, Ohio; Chong Yuan, Edison, N.J.

[73] Assignee: University of Cincinnati, Cincinnati, Ohio

[21] Appl. No.: 441,763

[22] Filed: May 16, 1995

[51] Int. Cl.$^6$ .................................................. H01L 21/20
[52] U.S. Cl. ......................... 438/479; 438/105; 438/931; 148/DIG. 148
[58] Field of Search ..................... 437/21, 100, 126; 148/DIG. 150, DIG. 148; 438/479, 105, 931

[56] References Cited

U.S. PATENT DOCUMENTS

| | | | |
|---|---|---|---|
| 3,634,149 | 1/1972 | Knippenberg | 437/126 |
| 4,496,609 | 1/1985 | McNeilly et al. | 427/585 |
| 4,910,153 | 3/1990 | Dickson | 437/100 |
| 4,912,064 | 3/1990 | Kong et al. | 437/100 |
| 4,983,538 | 1/1991 | Gotou | 438/459 |
| 5,210,051 | 5/1993 | Carter, Jr. | 437/126 |
| 5,415,126 | 5/1995 | Loboda et al. | 437/100 |
| 5,465,680 | 11/1995 | Loboda | 117/84 |

FOREIGN PATENT DOCUMENTS 0 609 799 A2  8/1994  European Pat. Off. ............. 437/100

OTHER PUBLICATIONS

Steckl et al., "Epitaxial Growth of B–SiC on Si by RTCVD with $C_3H_8$ and $SiH_4$"; IEEE Trans. Electron Dev. 39(1), pp. 64–74; Jan. 1992.

Steckl et al., "Growth of crystalline 3C–SiC at reduced temperature by CVD from Silacyclobutane"; Appl. Phys. Letter; 63(24):3347–3349; Dec. 13, 1993.

Yuan et al; "Effect of carbonization on the growth of 3C–SiC on Si(III) by Silacyclobutane"; Appl. Phys. Lett.; 64(22), pp. 3000–3002; May 30, 1994.

Li et al; "Nucleation and Void Formation Mechanisms in SiC Thin Film Growth on Si by Carbonization"; J. Electrochem. Soc.; 142(2):634–641; Feb. 02, 1995.

Steckl et al., "SiC SOI Structures by Direct Carbonization Conversion and Post Growth from Silacyclobutane"; Proc. Electrochem. Soc.; 94(11); pp. 117–122; May 1994.

"SiC Silicon–on–Insulator Structures by Direct Carbonization Conversion and Post Growth from Silacyclobutane" Steckl et al, J. Electrochem. Soc vol. 141, No. 6, Jun. 1994.

*Primary Examiner*—Michael Trinh
*Attorney, Agent, or Firm*—Frost & Jacobs LLP

[57] ABSTRACT

A method is disclosed for forming crystalline silicon carbide (SiC) semiconductors on a semiconductor-on-insulator (SOI) structure. In this method, the thin silicon layer of an SOI substrate is converted to silicon carbide using a carbonization reaction. The SiC layer is then, optionally, further increased in thickness using a vapor deposition reaction, preferably using a silicon-containing cyclobutane gas. Rather than increasing the thickness of the SiC layer, the vapor deposition process can also be used to deposit a layer of another semiconductor (e.g., a III-N or III-P semiconductor) on the thin SiC layer. The products made by this process are also claimed.

21 Claims, 1 Drawing Sheet

METHOD FOR FORMING SIC-SOI STRUCTURES

FIELD OF THE INVENTION

The present invention relates to a method of forming crystalline silicon carbide (SiC) semiconductors on a semiconductor-on-insulator (SOI) structure.

BACKGROUND OF THE INVENTION

Silicon carbide is an attractive semiconductor for applications requiring high operating conditions of temperature, speed, power and radiation. For these purposes, it has several materials properties which are superior to those of silicon, such as wider band gap, higher breakdown electric field, and higher thermal conductivity. However, silicon carbide also carries with it several problems, which make it difficult to adapt it to wide scale commercial use. For instance, the cost of bulk silicon carbide crystals is extremely high, the crystals are relatively difficult to make, and when they are made their size is limited to about 25 to 50 millimeters in diameter.

Silicon carbide has been formed by various methods (for example, carbonization and vapor deposition) on both silicon and silicon carbide substrates. See, for example, Steckl and Li, IEEE Trans. Electron. Dev., 39:64–74 (1992); Steckl, Yuan, Li, and Loboda, Appl. Phys. Lett., 63:3347–3349 (1993); Yuan, Steckl and Loboda, App. Phys. Lett., 64:3000–3002 (1994); and Li and Steckl, J. Electrochem. Soc., 142:634–641 (1995).

U.S. Pat. No. 5,415,126, Loboda, Li, Steckl and Yuan, issued May 16, 1995, describes a method for forming crystalline silicon carbide film on silicon substrates. In this method, a thin silicon carbide film is first formed on the silicon substrate by reacting the substrate with a hydrocarbon gas i.e., a carbonization reaction. Then, the substrate and film are heated to at least 600° C. and exposed to a silicon-containing cyclobutane gas in order to deposit crystalline silicon carbide onto the substrate (i.e., a vapor deposition process). The patent also teaches a similar process for depositing a silicon carbide film on a silicon carbide substrate.

Growing silicon carbide on SiC substrate results in the cost and limited size issues which are discussed above. On the other hand, the formation of SiC on silicon substrates tends to result in semiconductors which have certain characteristics, such as voids which form at the SiC-Si interface and micropipe defects, which can negatively affect semiconductor performance. In addition, since silicon is a conductor of electricity, the SiC-Si structure can effect the electrical characteristics of the silicon carbide semiconductor.

The present invention provides an effective way to form an SiC epitaxial layer on an insulator substrate (SOI). This process allows for the formation of SiC layers having a large area in a relatively simple, very cost effective manner. In addition, placing SiC on SOI allows the semiconductor to be electrically isolated from the substrate providing a product which consumes less power, is better for portable electronic devices, and is "pure" in its operation (i.e., there is less deviation from the theoretical semiconductor performance).

U.S. Pat. No. 4,983,583, Gotou, issued Jan. 8, 1991, describes a thermal bonding process for forming an SiC on SOI structure. In this method, two substrates are prepared, the first substrate is silicon coated with $SiO_2$, and the second is silicon on which SiC is hetero-epitaxially grown. These substrates are placed with their SiC and $SiO_2$ surfaces together, and then bonded to each other by heating. The silicon portion of the second substrate is then removed to expose the SiC layer.

U.S. Pat. No. 4,496,609, McNeilly, et al, issued Jan. 29, 1985, describes a process and apparatus for heating substrates to form semiconductor regions. The patent describes a reaction chamber formed from a material, such as quartz, which is transparent and non-obstructive to radiant heat energy transmitted at a pre-determined short wave length. Substrates placed in the chamber are heated uniformly and the single crystal semiconductor wafers formed exhibit little or no crystallographic slip.

SUMMARY OF THE INVENTION

The present invention relates to a method for forming an epitaxial silicon carbide layer on a silicon SOI substrate comprising the conversion of a thin silicon layer (preferably from about 0.1 to about 1 μm in thickness) on the SOI substrate to silicon carbide by carbonization.

The carbonization step can be followed by a vapor deposition step in which the substrate having the thin SiC layer formed by carbonization is heated above about 600° C. and exposed to one or more gases containing silicon and carbon for a sufficient time to increase the thickness of the SiC layer to a thickness of from about 10 to about 100 μm. In another embodiment, rather than using silicon and carbon in the vapor deposition step, the gases used contain III-N semiconductor materials, such as GaN, AlN, or InN, which form a III-N semiconductor layer on the SiC layer. The process of the present invention may also be used to form a layer of III-P semiconductor on the SiC layer.

DETAILED DESCRIPTION OF THE INVENTION

Figure 1:
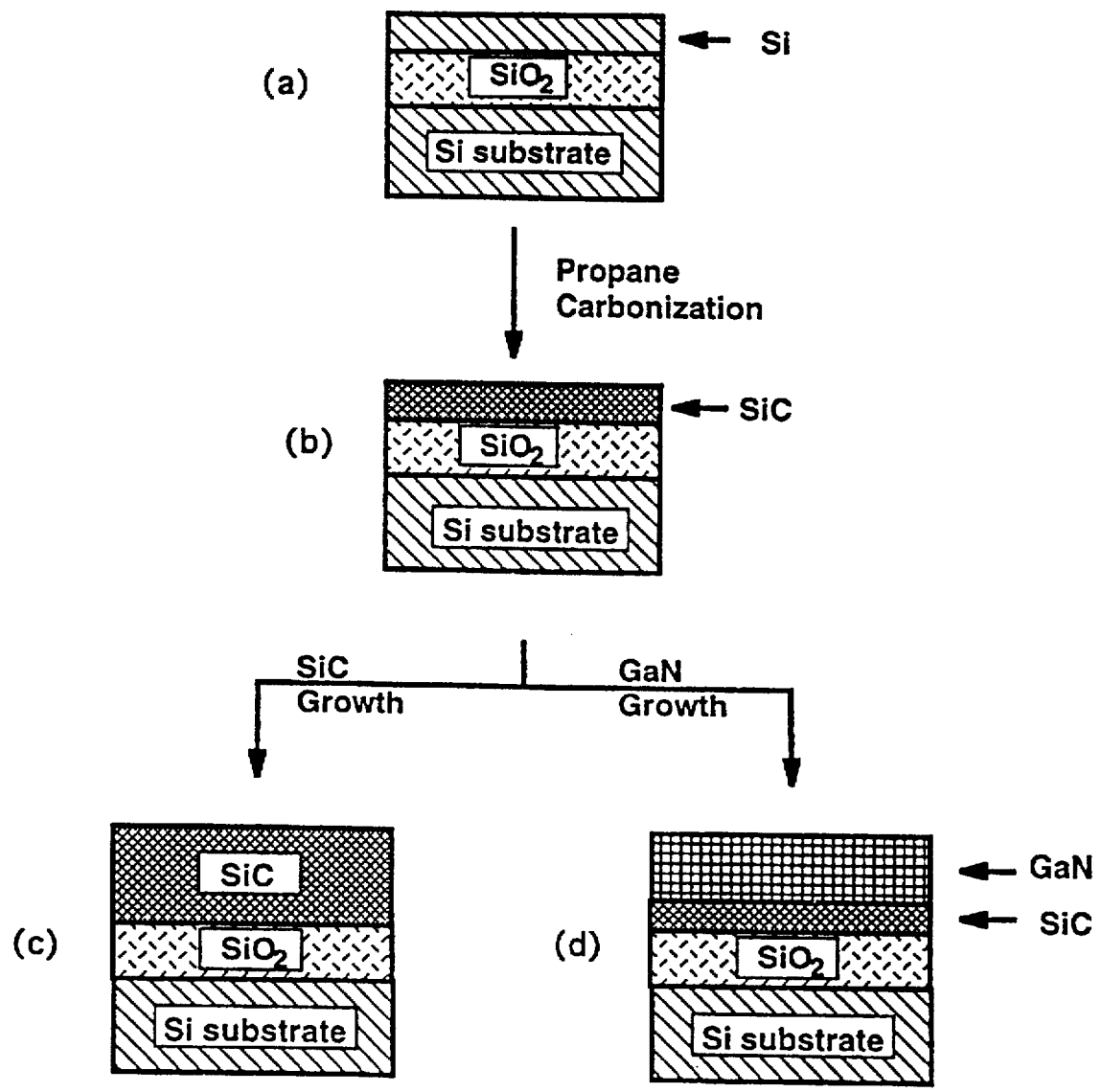
FIG. 1 is a schematic representation of the process of the present invention.

In the process of the present invention, initially, a thin silicon carbide (SiC) layer (generally having a thickness of from about 0.1 to about 1 μm) is formed on an SOI substrate using a direct carbonization reaction. If a thicker silicon carbide layer is desired, this is accomplished by following the carbonization reaction with a vapor deposition reaction using silicon- and carbon-containing gaseous precursors. Alternatively, if it is desired to deposit other types of semiconductors (e.g., GaN) on the initial silicon carbide layer, the vapor deposition reaction can utilize gaseous precursors containing those semiconductor materials.

The silicon SOI substrates used in the process of the present invention are generally well known in the art and are commercially available from, for example, Hughes Optical Systems, Inc. These SOI substrates generally comprise a single crystal silicon SOI wafer which includes a layer of silicon dioxide ($SiO_2$), generally having a thickness of from about 0.1 to about 1 μm, having on its surface a thin layer of silicon (thickness of from about 0.1 to about 1 μm). The silicon dioxide layer may have the silicon layer on both its top and bottom surfaces, or on just one of those surfaces.

The first step in the process is, preferably, cleaning the surface of the SOI substrate. This cleaning provides a pristine crystalline surface to ensure epitaxial growth. If such a surface is already available on the SOI substrate, the cleaning step is not necessary. Nearly any conventional method which provides the desired clean surface can be used and many of these methods are known in the art. For example, the substrate can be etched by dipping in an acid, such as hydrofluoric acid. Alternatively, the substrate can be etched in a corrosive atmosphere, such as HCl/$H_2$, at elevated temperatures (for example, greater than about 1,000° C.).

A layer of silicon carbide is then formed on the surface of the SOI substrate, by completely converting the silicon top layer of the silicon substrate to silicon carbide. This is illustrated schematically by the conversion of (a) to (b) in FIG. 1. The thickness of this top layer is very important and should generally be in the range of from about 0.1 to about 1 μm. If the layer is too thick, its conversion to silicon carbide will not be uniform and the resulting semiconductor will not be satisfactory. Processes for growing these layers are well known in the art. One example of such a process involves exposing the silicon to a hydrocarbon gas at elevated temperatures (e.g., greater than about 1,000° C.) under atmospheric or low pressure conditions. This reaction is called carbonization. Carbonization reactions are well known in the art and are described in, for example, Steckl and Li, IEEE Trans. Electron. Dev., 39:64–74 (1992); Yuan, Steckl and Loboda, Appl. Phys. Lett., 64:3000–3002 (1994); Steckl, Yuan, Tong, Gosele and Loboda, J. Electrochem. Soc., 141:66–68 (1994); and Li and Steckl, J. Electrochem. Soc. 142:634–641 (1995), all of which are incorporated herein by reference.

Hydrocarbons, such as methane, ethane, propane, butane, ethylene, acetylene, and the like, as well as mixtures of those materials, may all be used in the carbonization reaction. The carbonization reaction is carried out at a temperature in excess of about 1,000° C., preferably from about 1,100° C. to about 1,300° C. The pressure at which the reaction is carried out is generally either atmospheric pressure or lower than atmospheric pressure, and is preferably in the range of from about 5 to about 760 Torr. The time necessary for formation of the silicon carbide film varies depending on the nature of the reactants and the reaction conditions, as well as the silicon layer thickness, since the entire silicon layer needs to be converted into silicon carbide. Generally, reaction times of from about 1 to about 10 minutes are sufficient. A specific example of a carbonization process includes directing a stream of gas comprising propane (at a flow rate of 9 sccm) and hydrogen (at a flow rate of 0.9 liter per minute) at the substrate under atmospheric pressure at 1,300° C. to produce a 25 nanometer thick layer of SiC per minute.

If a semiconductor layer having a thickness greater than about 0.1 to about 1 μm is desired, that layer can then be built up using a vapor deposition reaction (post growth). This reaction may be used either to increase the thickness of the silicon carbide layer (illustrated schematically in the conversion of (b) to (c) in FIG. 1), or to grow a layer of another semiconductor onto the initial SiC layer (illustrated schematically in the conversion of (b) to (d) in FIG. 1). Vapor deposition reactions are well known in the art. See, for example, Steckl and Li, IEEE Trans. Electron. Dev., 39:64–74 (1992); Steckl, Yuan, Li and Loboda, Appl. Phys. Lett., 63:3347–3349 (1993); and Steckl, Yuan, Tong, Gosele and Loboda, J. Electrochem. Soc., 141:66–68 (1994), all of which are incorporated herein by reference. In the vapor deposition process, the substrate is heated to the desired temperature in a deposition chamber followed by exposing the substrate to a gas or gases from which the materials are deposited onto the substrate. For example, if silicon carbide is to be deposited onto the substrate, the gases should contain silicon and carbon components. If another semiconductor is to be deposited onto the substrate surface, the components of that semiconductor are included in the gases. Substrate temperatures above about 600° C. are useful herein, with temperatures in the range of from about 600° C. to about 1,200° C. being preferred. More preferred are temperatures in the range of from about 600° C. to about 1,000° C.

The time necessary for the formation of the films varies depending on the concentration of the materials to be deposited in the gases, the reaction conditions, and the desired film thickness. Generally, exposure times of from about 1 to about 100, preferably from about 1 to about 30, minutes are sufficient.

Where silicon carbide is to be deposited onto the substrate, the source gases used in the vapor deposition process step are selected from the group consisting of silicon-containing silanes, hydrocarbons, other more complex organic molecules (such as cyclobutanes) and mixtures thereof. The preferred source gas is silicon-containing cyclobutane. More specifically, the preferred gases are cyclobutanes in which one or more of the carbon atoms of the ring have been replaced by silicon atoms, provided enough carbon remains to form the SiC. Cyclobutanes with one silicon atom include silacyclobutanes represented by the formula:

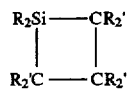

where each R is independently selected from the group consisting of hydrogen, fluorine, and hydrocarbon radicals having one to four carbon atoms, and each R' is independently selected from the group consisting of hydrogen and hydrocarbon radicals having one to four carbon atoms. For example, useful silacyclobutanes include the parent compound silacyclobutane ($H_2SiC_3H_6$) and derivatives such as 1, 1-difluorosilacyclobutane, 1-methylsilacyclobutane, 1, 1-dimethylsilacyclobutane, 1,1-ethylmethyl-silacyclobutane, 1-butylsilacyclobutane, 2,4-dimethylsilacyclobutane, 3,3-diethyl-silacyclobutane, and 3,3-ethylpropylsilacyclobutane.

Cyclobutanes with two silicon atoms include 1,3-disilacyclobutanes represented by the formula:

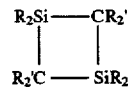

where each R and R' has the same meaning as described above. For example, useful 1,3-disilacyclobutanes include the parent compound 1, 3-disilacyclobutane and derivatives such as 1,1,3,3-tetrafluoro - 1,3 disilacyclobutane, 1-methyl - 1,3-disilacyclobutane, 1,3-dimethyl - 1,3-disilacyclobutane, 1,1-ethylmethyl - 1,3-disilacyclobutane, 1-butyl - 1,3-disilacyclobutane, 2,4-dimethyl - 1,3-disilacyclobutane, 2,2-diethyl - 1,3-disilacyclobutane, and 2,4-ethylpropyl - 1,3-disilacyclobutane.

While it should be apparent to one skilled in the art that other volatile silicon-containing gases may function equivalently as the source gases for the vapor deposition reaction in the present invention, it is believed that the silacyclobutanes and 1,3-disilacyclobutanes, described above, are preferable because of their ease of handling, ready availability, and the fact that they permit the reaction to be carried out at a somewhat lower temperature.

The above silacyclobutane and 1,3-disilacyclobutane, as well as their derivatives, are known materials and methods for their preparation are known in the art. For example, the preparation of silacyclobutane from 1,1-dichlorosilacyclobutane by lithium aluminum hydride reduction is described in J. Laane, J. Am. Chem. Soc., 89:1144 (1967).

The gases utilized in the vapor deposition reaction are generally diluted in the deposition chamber with an inert carrier gas. Such carriers can include, for example, hydrogen, argon and helium. Although the amount of dilution is dependent on the rate of exposure to the substrate, generally dilutions of deposition gas:carrier gas in the range of from about 1:1 to about 1:10,000 are used. Of course, mixtures of more than one of the silicon-containing gas species may also be used, together with a carrier gas where appropriate.

Another application of the present invention is to grow materials other than SiC by vapor deposition on top of the initial SiC layer which is formed by carbonization. Materials for which the process would be advantageous are currently not generally available as crystalline substrates. These materials must generally have similar structural properties to SiC (e.g., crystal type and lattice constant) in order to be used in the process of the present invention. Examples of such materials are those in the category known as III-N semiconductor materials, and, secondarily, the so-called III-P materials. These materials include: (a) BN, GaN, AlN, and InN, and (b) BP, GaP and InP. Thin films of other semiconductors, and of insulators or metals, may also be advantageously grown on the SiC-SOI substrate. The III-N materials also have a wider energy band gap than does SiC and in certain cases a good lattice match between the III-N material and SiC has been formed. Since the III-N semiconductors do not currently have a native substrate in which devices can be fabricated, they require the use of a substrate consisting of a different material. Therefore, the growth of materials, such as GaN, on SiC-SOI, using the present invention, can be an excellent method of overcoming this problem. Examples of source gases which can be used to deposit these materials include trimethyl gallium and ammonia.

The layers formed by the vapor deposition step of the present invention are from about 0.01 μm to about 100 μm, preferably from about 0.1 μm to about 10 μm, in thickness.

The total pressure of the gases in the deposition chamber can be varied over a wide range and is generally controlled to a level which provides a reasonable rate of epitaxial growth. Generally pressures from about $10^{-3}$ Torr to about atmospheric pressure are used.

The amount of chemical vapor introduced into the deposition chamber during the vapor deposition step should be that which allows for a desirable SiC (or III-N or III-P) film growth rate. It is preferred, however, that the deposition chamber be "starved" such that nearly all of the silicon-containing gas in the atmosphere is deposited, thereby slowly growing the crystalline structure. Growth rates in the range of from about 1 to about 10 nanometers per minute may generally be achieved.

The process of the present invention can be conducted under static conditions, but it is usually preferred to continuously introduce a controlled amount of vapor into one portion of a chamber while drawing a vacuum from another site in the chamber so as to cause flow of the vapor to be uniform over the area of the substrate.

The deposition chamber used in the process of the present invention can be any which facilitates the growth of films by a chemical vapor deposition process. Examples of such chambers are described in Golecki, et al, Appl. Phys. Lett., 60:14 (1992); and Steckl, et al, IEEE Trans. Electron. Dev., 39:64–74 (1992), both incorporated herein by reference.

In addition, it is contemplated that the crystalline silicon carbide epitaxial growth can be assisted by a variety of processes. For instance, it is contemplated that molecular beam epitaxy, lasers and/or ion beams can be used to excite the gaseous species and, thereby, grow the epitaxial layer at lower temperatures.

The resultant silicon carbide films formed are crystalline 3C SiC. They can be grown in a wide variety of thicknesses, such as from about 0.01 μm up to and exceeding about 100 μm. These films exhibit transmission electron diffraction patterns consisting only of sharp spots with cubic symmetry. X-ray diffraction of these films exhibit primarily the (200) and (400) SiC lines.

The following non-limiting examples are for illustration purposes only and are not intended to limit the scope of the present invention.

EXAMPLE 1

3C-SiC layers are grown by rapid thermal carbonization followed by vapor deposition on Si-SOI samples which have an original Si device layer of about 600 to 1,000 Å. The wafers are pretreated at 900°–1100° C. under 1.9 liter per minute $H_2$ for one minute at atmospheric pressure. This step provides an in-situ cleaning of the Si surface, with a minimum of surface roughness being introduced. The carbonization process conditions are chosen to provide a complete conversion from Si to SiC. A conversion rate of 500 Å per minute is established at 1300° C. using 9 sccm $C_3H_8$ (diluted to 5% in $H_2$) and 0.9 liter per minute of hydrogen gas. The carbonization reaction is carried out for 1 minute.

After carbonization of the Si-SOI structure, x-ray diffraction measurements confirm the presence of a (100) 3C-SiC layer. Typical x-ray diffraction spectra exhibit primarily the (200) SiC peak at 2 θ=41.44° from a SiC-SOI structure obtained by carbonization, with a minor contribution from the (400) reflection. The FWHM of the (200) SiC peak is 0.3°, or 0.24° after system broadening correction. This indicates the growth of a crystalline layer, as in the case of carbonization of Si substrates by the same method. Confirmation of the Si conversion to SiC is also provided by Fourier transform infrared transmission. A sharp absorption peak observed at 800 $cm^{-1}$ corresponds to the Si-C bond, while a broad peak at about 1100 $cm^1$ is due to absorption in the oxide layer. The FWHM of the peak of Si-C bonding is 25 $cm^1$, which is comparable to the result produced by a SiC film grown directly on Si with silacyclobutane-$SiC_3H_8$ (SCB). Thus, the infrared measurement also confirms the fabrication of a SiC-SOI structure by direct conversion of a Si-SOI structure.

EXAMPLE 2

Direct SiC-SOI structure formation is augmented by subsequent growth of SiC on the carbonized layer (formed according to Example 1) performed at 900° C. and low pressure (5 Torr) using silacyclobutane-$SiC_3$ $H_8$ (SCB). Conditions of 1 sccm SCB flow rate combined with 1.9 liter per minute hydrogen produces a total SiC thickness (including the SiC layer produced by direct conversion) of about 4500 Å in 2 minutes.

After carbonization and further growth with SCB, the surface is still smooth and mirror-like under visual observation. This is further confirmed under electron microscope (SEM) observation, with no surface features being detected.

Cross-sectional SEM indicates a very sharp SiC/SiO$_2$ interface, with no voids or inclusions. This is extremely important since, under most conditions, growth of SiC on Si results in significant void formation.

The composition of the SiC film grown on the Si-SOI structure is investigated by Auger Electron Spectroscopy (AES). An Auger depth profile of a SiC film obtained by carbonization and subsequent vapor deposition growth with SCB (according to the examples herein) shows that the film composition is fairly uniform in depth. The direct transition from the SiC film to the underlying SiO$_2$ layer indicates that any pure Si region between the silicon dioxide and silicon carbide is either thinner than the depth resolution of the measurement or, more likely, non-existent. In turn, this confirms that the original silicon has been completely converted to silicon carbide.

EXAMPLE 3

Using the basic procedures described in Examples 1 and 2, SiC-SOI structures can be used as substrates on which to grow III-V nitrides (or phosphides) including GaN, InN, AlN and their alloys: AlGaN, InGaN and AlInGaN. The precursors for group III include Al-, Ga-, and In-based metalorganics, such as trimethyl gallium (TMG), triethyl gallium (TEG), trimethyl indium (TMI), trimethyl aluminum (TMA), and trimethyl amine alane (TMAA). The precursors for group V include nitrogen-based materials such as ammonia (NH$_3$). The growth temperature ranges from about 200° to 1,200° C. The growth pressure is between about 0.1 to 760 Torr. The material grown epitaxially on the SiC-SOI substrate can be a single layer from any of the III-V nitride group (e.g., GaN grown on SiC-SOI) or a sequence of multiple layers consisting of a combination of these materials (e.g., InGaN/GaN/AlN on SiC-SOI). In addition to chemical vapor deposition, other techniques such as atomic layer epitaxy and molecular beam epitaxy may be used to grow the III-V nitride layer.

What is claimed is:

1. A method of forming an epitaxial silicon carbide layer on an SOI substrate having a silicon layer comprising converting the silicon layer on the SOI substrate to said silicon carbide layer by a carbonization reaction.

2. The method of claim 1 wherein the silicon carbide layer formed in the carbonization reaction having a thickness of from about 0.1 to about 1 µm.

3. The method according to claim 1 wherein the SOI substrate is cleaned prior to the carbonization reaction.

4. The method according to claim 3 wherein the cleaning step is carried out by a method selected from the group consisting of dipping the substrate in acid, and exposing the substrate to HCl/H$_2$ at a temperature of greater than about 1000° C.

5. The method according to claim 2 wherein, in the carbonization reaction, the substrate is exposed to a gas mixture comprising a hydrocarbon and hydrogen gas at a temperature greater than about 1000° C.

6. A method according to claim 5 wherein the hydrocarbon gas is selected from the group consisting of methane, ethane, propane, butane, ethylene, acetylene, and mixtures thereof.

7. The method according to claim 2 wherein, following carbonization, the substrate having said SiC layer is heated above about 600° C. and exposed to one or more gases containing silicon and carbon for a sufficient time to form an SiC layer having a total thickness of from about 0.01 to about 100 µm.

8. The method according to claim 7 wherein the gases containing silicon and carbon are selected from the group consisting of silicon-containing hydrocarbons, silanes, and mixtures thereof.

9. The method according to claim 8 wherein the gas containing silicon and carbon comprises silicon-containing cyclobutane.

10. The method according to claim 9 wherein the cyclobutane is selected from the group consisting of:

(a)

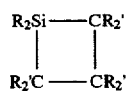

(b)

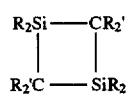

(c) and mixtures thereof, wherein each R is independently selected from the group consisting of hydrogen, fluorine, and hydrocarbon radicals having 1–4 carbon atoms, and each R' is independently selected from the group consisting of hydrogen, and hydrocarbon radicals having 1–4 carbon atoms.

11. The method according to claim 9 wherein the gas containing silicon and carbon is mixed with an inert carrier gas such that the ratio of SiC gas:carrier gas is from about 1:1 to about 1:10,000.

12. The method according to claim 9 wherein the substrate having said SiC layer is heated to from about 650° C. to about 1,000° C.

13. The method according to claim 12 wherein the heated substrate is exposed to the silicon-containing cyclobutane gas for from about 1 to about 100 minutes.

14. The method according to claim 13 wherein the heated substrate is exposed to the silicon-containing cyclobutane gas at a pressure of from about 10$^{-3}$ Torr to about atmospheric pressure.

15. A method of forming an epitaxial silicon carbide layer on an SOI substrate having a silicon layer comprising the steps of (a) cleaning said substrate by dipping it in an acid or exposing it to HCl/H$_2$ at a temperature of greater than about 1,000° C.;

(b) converting the silicon layer on said substrate to said silicon carbide layer having a thickness of from about 0.1 to about 1 µm by carbonization, wherein the substrate is exposed to a gas mixture comprising a hydrocarbon selected from the group consisting of methane, ethane, propane, butane, ethylene, acetylene, and mixtures thereof, together with hydrogen gas at a temperature of greater than about 1,000° C.; and (c) heating said substrate to temperature of from about 650° C. to about 1,000° C. and exposing it to a silicon-containing cyclobutane gas at a pressure of from about 10$^{-3}$ Torr to about atmospheric pressure, for a period of time of from about 1 to about 30 minutes, so as to form an SiC layer on said substrate having a total thickness of from about 1 to about 10 µm.

16. The method according to claim 2 wherein, following carbonization, the substrate having said SiC layer is heated above about 600° C. and exposed to one or more gases containing III-N or III-P semiconductor materials for a sufficient time to form a III-N or III-P semiconductor layer on said SiC layer.

17. The method according to claim 16 wherein said III-N semiconductor layer has a thickness of from about 0.1 to about 10 μm.

18. The method according to claim 17 wherein the gases used in said vapor deposition step are selected from those containing B, Ga, Al, In, N, P and mixtures thereof.

19. The method according to claim 18 wherein the substrate having said SiC layer is heated to from about 650° C. to about 1,000° C.

20. The method according to claim 19 wherein the heated substrate is exposed to the III-N or III-P semiconductor-containing gas for from about 1 minute to about 30 minutes.

21. The method according to claim 20 wherein the heated substrate is exposed to the III-N or III-P semiconductor-containing gas at a pressure of from about $10^{-3}$ Torr to about atmospheric pressure.

* * * * *